United States Patent
Iwakaji et al.

(10) Patent No.: US 11,908,925 B2
(45) Date of Patent: Feb. 20, 2024

(54) SEMICONDUCTOR DEVICE AND METHOD FOR CONTROLLING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yoko Iwakaji, Tokyo (JP); Tomoko Matsudai, Tokyo (JP); Hiroko Itokazu, Kawasaki Kanagawa (JP); Keiko Kawamura, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 343 days.

(21) Appl. No.: 17/468,239

(22) Filed: Sep. 7, 2021

(65) Prior Publication Data
US 2022/0328666 A1 Oct. 13, 2022

(30) Foreign Application Priority Data

Apr. 9, 2021 (JP) .................................. 2021-066177
Jul. 21, 2021 (JP) .................................. 2021-120186

(51) Int. Cl.
*H01L 29/739* (2006.01)
*H01L 29/08* (2006.01)
(Continued)

(52) U.S. Cl.
CPC ...... *H01L 29/7397* (2013.01); *H01L 29/0804* (2013.01); *H01L 29/42304* (2013.01); *H03K 17/567* (2013.01); *H01L 29/0696* (2013.01)

(58) Field of Classification Search
CPC ............. H01L 29/7397; H01L 29/0804; H01L 29/42304; H01L 29/0696; H03K 17/567
(Continued)

(56) References Cited

U.S. PATENT DOCUMENTS

| 5,751,024 | A | 5/1998 | Takahashi |
| 8,129,818 | B2 | 3/2012 | Tooi et al. |

(Continued)

FOREIGN PATENT DOCUMENTS

| JP | 3288218 B2 | 6/2002 |
| JP | 5327226 B2 | 10/2013 |

(Continued)

*Primary Examiner* — Igwe U Anya
(74) *Attorney, Agent, or Firm* — Allen & Overy LLP

(57) ABSTRACT

A semiconductor device includes a first electrode, a second electrode, a first semiconductor region, a second semiconductor region, a third semiconductor region, a fourth semiconductor region, a fifth semiconductor region, a first gate electrode, and a second gate electrode. The first gate electrode faces the second semiconductor region via a first insulating film. The second gate electrode faces the second semiconductor region via a second insulating film and faces the second electrode via a third insulating film contacting the second insulating film. The fifth semiconductor region includes a boundary portion that electrically contacts the second electrode. A distance between an upper surface of the fourth semiconductor region and the first electrode is greater than a distance between the boundary portion and the first electrode.

12 Claims, 14 Drawing Sheets

(51) Int. Cl.
  *H01L 29/423*    (2006.01)
  *H01L 29/06*    (2006.01)
  *H03K 17/567*    (2006.01)
(58) Field of Classification Search
  USPC ........................................................ 257/586
  See application file for complete search history.

(56) References Cited

U.S. PATENT DOCUMENTS

| | | | |
|---|---|---|---|
| 10,090,404 B2 | 10/2018 | Hikasa | |
| 2015/0091326 A1 | 4/2015 | Kuroda et al. | |
| 2015/0263150 A1* | 9/2015 | Matsudai | H01L 29/407 |
| | | | 438/135 |
| 2020/0091323 A1 | 3/2020 | Iwakaji et al. | |
| 2020/0091326 A1 | 3/2020 | Iwakaji et al. | |
| 2020/0303526 A1 | 9/2020 | Iwakaji et al. | |

FOREIGN PATENT DOCUMENTS

| | | |
|---|---|---|
| JP | 2015-177010 A | 10/2015 |
| JP | 2019-201217 A | 11/2019 |
| JP | 2020-047789 A | 3/2020 |
| JP | 2020-047790 A | 3/2020 |
| JP | 2020-155581 A | 9/2020 |

* cited by examiner

SEMICONDUCTOR DEVICE AND METHOD FOR CONTROLLING SEMICONDUCTOR DEVICE

CROSS-REFERENCE TO RELATED APPLICATIONS

This application is based upon and claims the benefit of priority from Japanese Patent Application No. 2021-066177, filed on Apr. 9, 2021; the entire contents of which are incorporated herein by reference.

This application is also based upon and claims the benefit of priority from Japanese Patent Application No. 2021-120186, filed on Jul. 21, 2021; the entire contents of which are incorporated herein by reference.

FIELD

Embodiments relate to a semiconductor device and a method for controlling the same.

BACKGROUND

A semiconductor device such as an insulated gate bipolar transistor (IGBT) or the like is used as a switching element. To reduce the on-resistance of an IGBT, it is effective to increase the carrier concentration of the drift region in the on-state. On the other hand, if the ejection of the carriers of the drift region is slow when turning off the IGBT, the turn-off time lengthens, and the switching loss increases.

It is desirable for a semiconductor device to have suppressed element breakdown, a lower on-resistance, a lower switching loss, and the like.

DETAILED DESCRIPTION

Figure 1A:
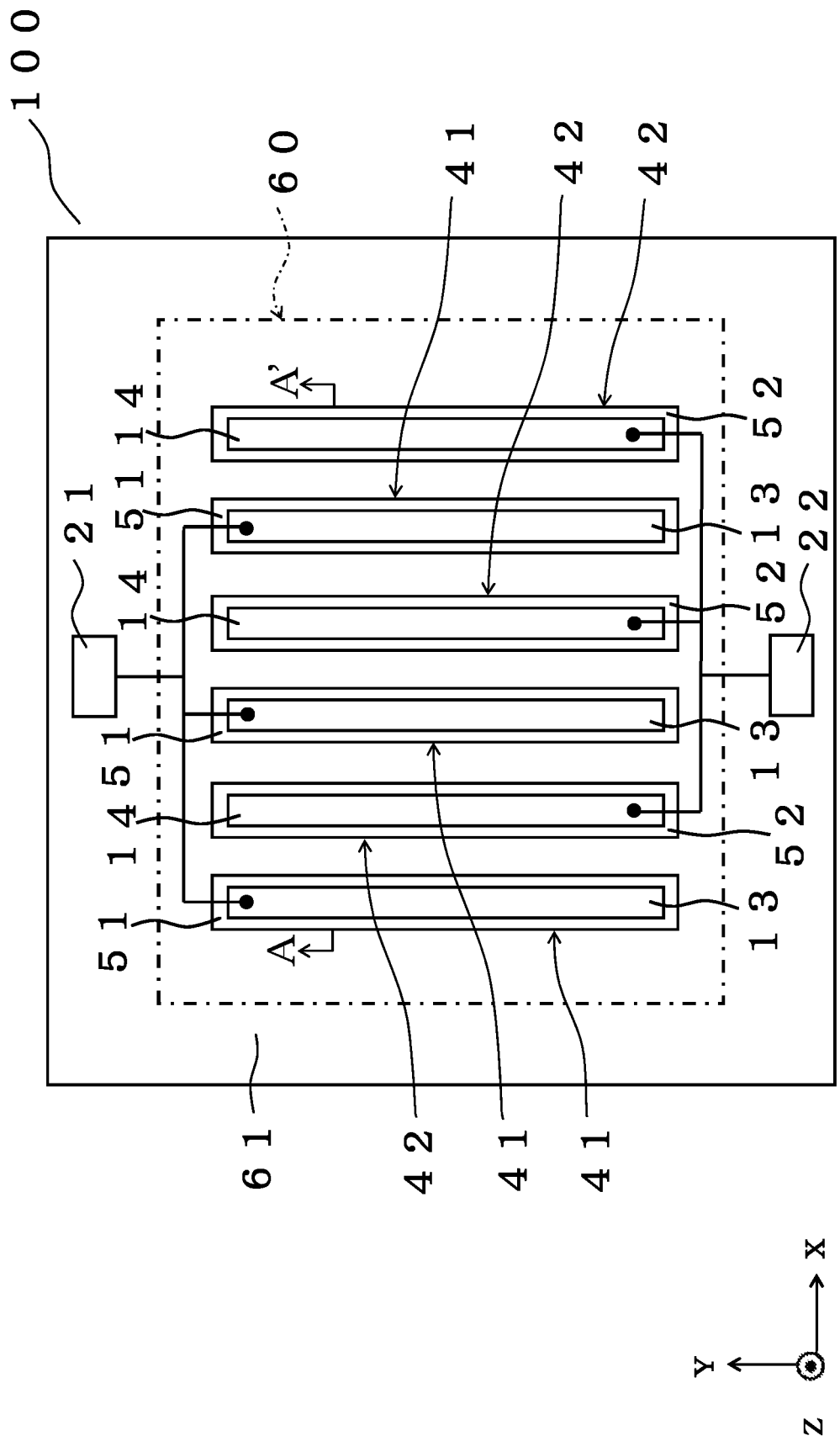
FIG. 1A is a plan view of a semiconductor device 100 according to a first embodiment.

A semiconductor device according to one embodiment, includes a first electrode, a second electrode, a first semiconductor region, a second semiconductor region, a third semiconductor region, a fourth semiconductor region, a fifth semiconductor region, a first gate electrode, and a second gate electrode. The second electrode is separated from the first electrode in a first direction. The first semiconductor region is located between the first electrode and the second electrode in the first direction. The first semiconductor region is of a first conductivity type. The second semiconductor region is located between the first semiconductor region and the second electrode. The second semiconductor region is of a second conductivity type. The third semiconductor region is located between the first semiconductor region and the first electrode. The third semiconductor region is of the second conductivity type and is electrically connected with the first electrode. The first gate electrode faces the second semiconductor region via a first insulating film in a second direction. The first gate electrode faces the second electrode via a third insulating film. The second direction crosses the first direction. The third insulating film contacts the first insulating film. A plurality of the first gate electrodes are provided. The second gate electrode faces the second semiconductor region via a second insulating film in the second direction. The second gate electrode faces the second electrode via the third insulating film. The third insulating film contacts the second insulating film. A different voltage from the first gate electrode is applied to the second gate electrode. A plurality of the second gate electrodes are provided. The fourth semiconductor region is located between the second semiconductor region and the second electrode. The fourth semiconductor region is of the first conductivity type and is next to the first gate electrode with the first or third insulating film interposed. The fifth semiconductor region is located between the second semiconductor region and the second electrode. The fifth semiconductor region is of the second conductivity type, is next to the second gate electrode with the second or third insulating film interposed, and includes a boundary portion that electrically contacts the second electrode. A distance between an upper surface of the fourth semiconductor region and the first electrode is greater than a distance between the boundary portion and the first electrode.

Embodiments of the invention will now be described with reference to the drawings. Common portions in all of the drawings of the description are marked with common reference numerals. The dimensional ratios of the drawings are not limited to the illustrated ratios. The embodiments do not limit the invention.

First Embodiment

Structure of Semiconductor Device 100

Figure 1B:
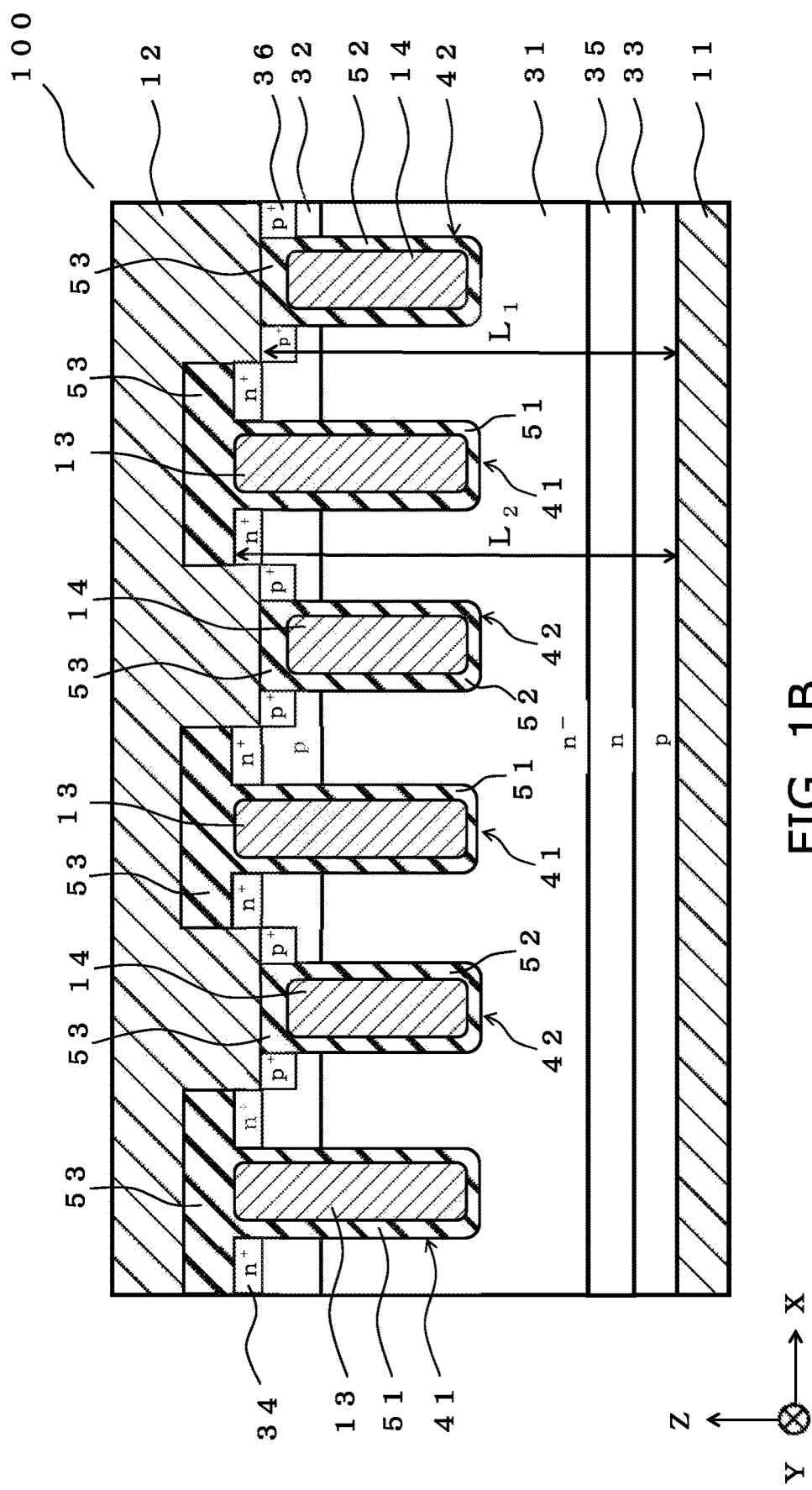
FIG. 1B is a cross-sectional view along line A-A' shown in FIG. 1A.
Figure 1C:
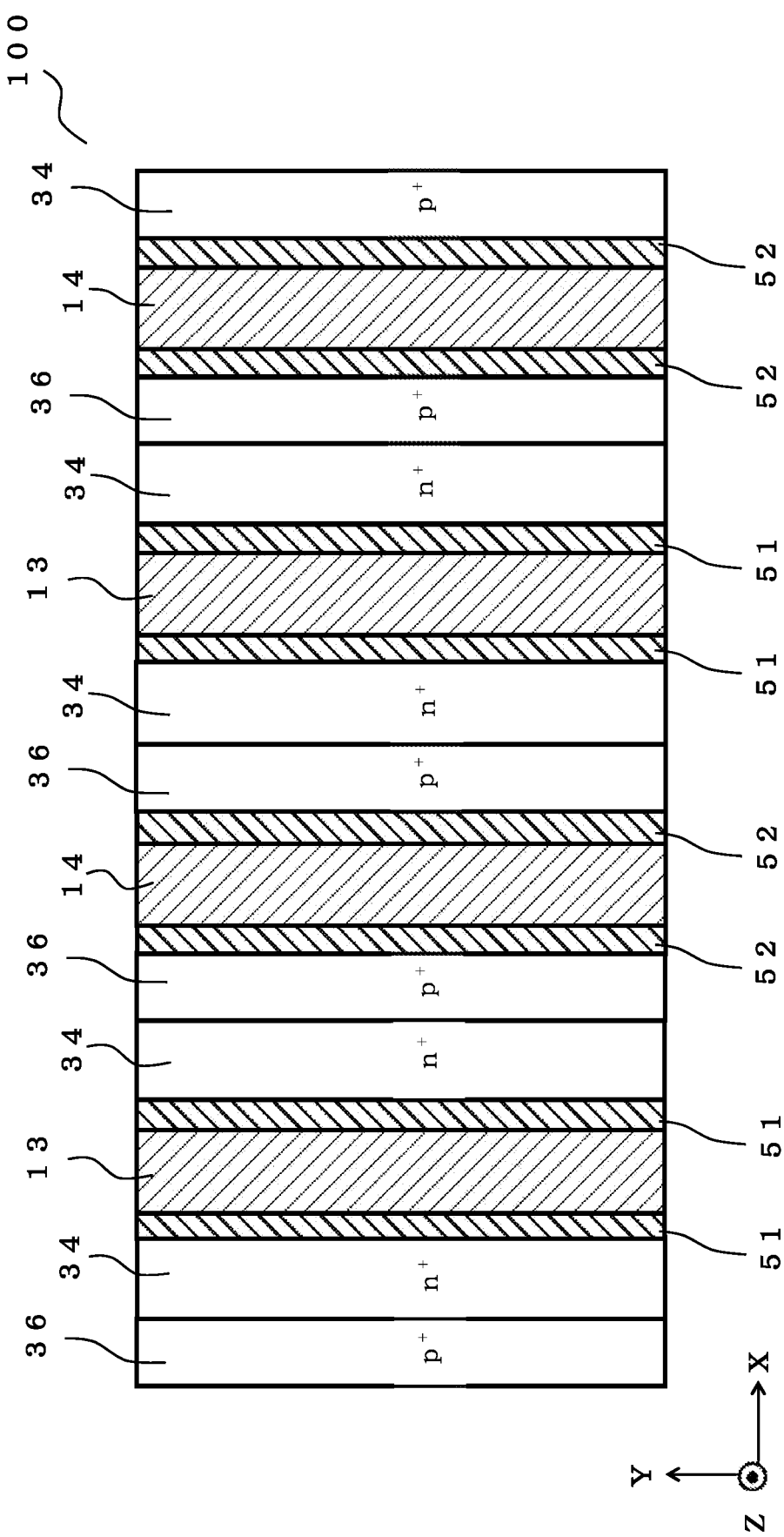
FIG. 1C is a partial plan view of the semiconductor device 100 according to the first embodiment.
Figure 1D:
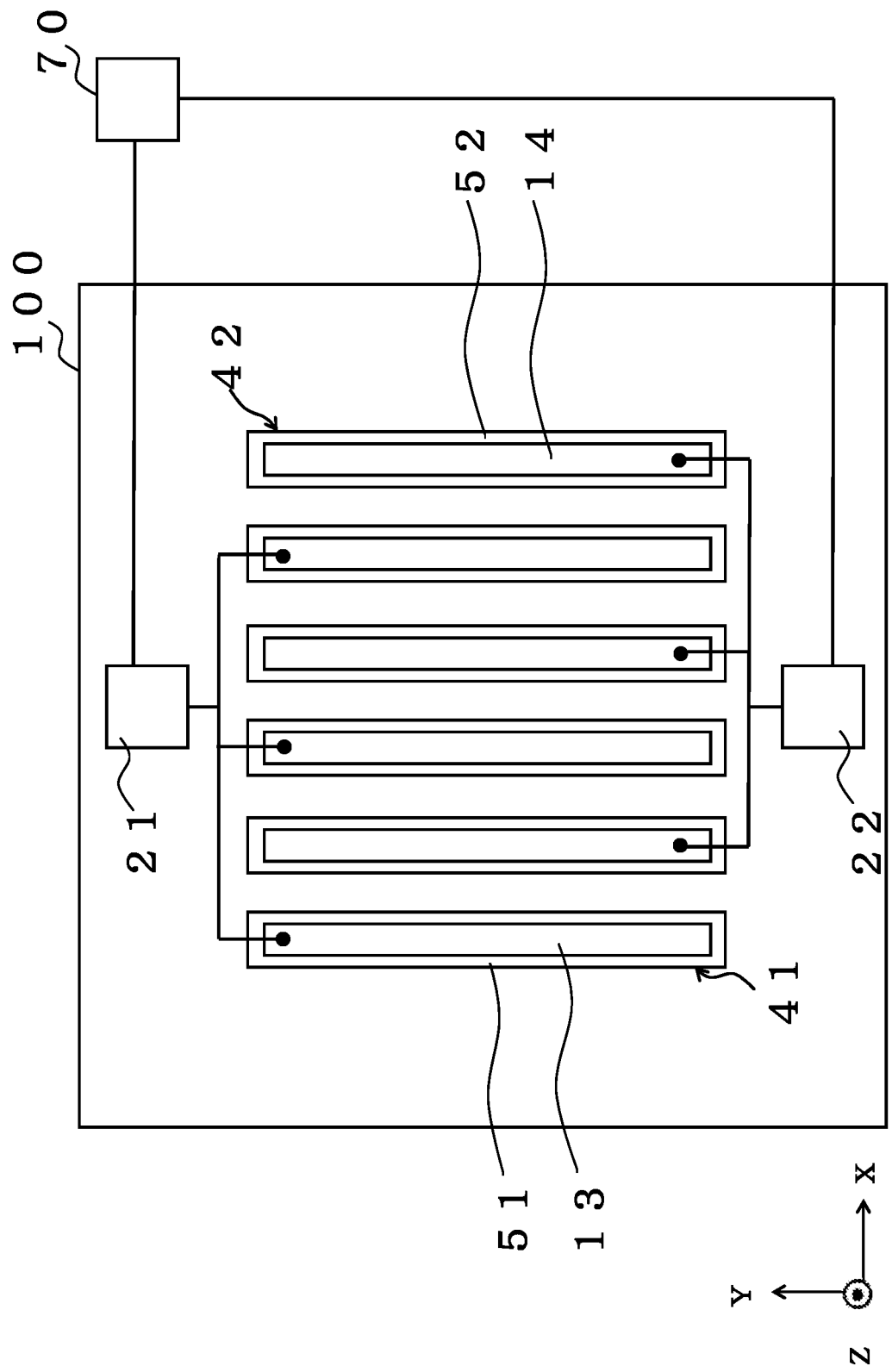
FIG. 1D is a schematic view of a semiconductor device circuit according to the first embodiment.

A semiconductor device 100 according to a first embodiment will now be described with reference to FIGS. 1A to 1D. FIG. 1A is a plan view of the semiconductor device 100 according to the first embodiment; FIG. 1B is a cross-sectional view along line A-A' shown in FIG. 1A; FIG. 1C is a partial plan view of the semiconductor device 100 according to the first embodiment; and FIG. 1D is a schematic view of the semiconductor device circuit according to the first embodiment.

The semiconductor device according to the first embodiment is a trench gate-type IGBT that includes gate electrodes in trenches formed in a semiconductor layer. The semiconductor device 100 according to the first embodiment is an IGBT in which double-gate driving is possible. Hereinbelow, an example is described in which a first conductivity type is an n-type, and a second conductivity type is a p-type. In the following description, the notations of $n^+$, n, $n^-$, $p^+$, p, and $p^-$ indicate relative levels of the impurity concentrations of the conductivity types. In other words, $n^+$ indicates that the n-type impurity concentration is relatively higher than that of n; and $n^-$ indicates that the n-type impurity concentration is relatively lower than that of n. Also, $p^+$ indicates that the p-type impurity concentration is relatively higher than that of p; and $p^-$ indicates that the p-type impurity concentration is relatively lower than that of p. The $n^+$-type and the $n^-$-type may be recited as simply the n-type; and the $p^+$-type and the $p^-$-type may be recited as simply the p-type.

The semiconductor device 100 according to the first embodiment includes a collector electrode (a first electrode) 11, an emitter electrode (a second electrode) 12, a first gate electrode 13, a second gate electrode 14, a first gate electrode pad 21, a second gate electrode pad 22, an $n^-$-type drift region (a first semiconductor region) 31, a p-type base region (a second semiconductor region) 32, a p-type collector region (a third semiconductor region) 33, an $n^+$-type emitter region (a fourth semiconductor region) 34, an n-type buffer region 35, a $p^+$-type contact region (a fifth semiconductor region) 36, a first gate insulating film (a first insulating film) 51, a second gate insulating film (a second insulating film) 52, and an inter-layer insulating film (a third insulating film) 53.

In the semiconductor device 100, the direction from the collector electrode 11 toward the emitter electrode 12 is taken as a Z-direction (a first direction). A direction orthogonal to the Z-direction is taken as an X-direction (a second direction); and a direction orthogonal to the X-direction and the Z-direction is taken as a Y-direction. FIGS. 1A, 1C, and 1D are plan views in the X-Y plane of the semiconductor device 100; and FIG. 1B is a cross-sectional view in the X-Z plane of the semiconductor device 100. Although the X-direction, the Y-direction, and the Z-direction according to the embodiment have an orthogonal relationship, the relationship is not limited to orthogonal; it is sufficient to cross each other. Moreover, for the sake of explanation, the direction from the collector electrode 11 to the emitter electrode 12 is referred to as "up", and the opposite direction is referred to as "down".

The collector electrode 11 is separated from the emitter electrode 12 in the Z-direction. A collector voltage is applied to the collector electrode 11. The collector voltage is, for example, not less than 200 V and not more than 6500 V.

An emitter voltage is applied to the emitter electrode 12. The emitter voltage is, for example, 0 V.

The collector electrode 11 and the emitter electrode 12 are made of, for example, aluminum (Al).

The collector region 33 is a p-type semiconductor region that is located between the collector electrode 11 and the emitter electrode 12 in the Z-direction. The collector region 33 is in contact with and electrically connected to the collector electrode 11. The collector region 33 is a supply source of holes when the semiconductor device 100 is in the on-state.

The drift region 31 is an $n^-$-type semiconductor region located between the collector region 33 and the emitter electrode 12. The drift region 31 is the path of the on-current when the semiconductor device 100 is in the on-state. When the semiconductor device 100 is in the off-state, the drift region 31 is depleted by a depletion layer that spreads from the interface with the base region 32, and has the function of maintaining the breakdown voltage of the semiconductor device 100.

The base region 32 is a p-type semiconductor region that is located between the drift region 31 and the emitter electrode 12. An inversion layer is formed in the base region 32 when the semiconductor device 100 is in the on-state; and the base region 32 functions as a channel region of the transistor.

The buffer region 35 is an n-type semiconductor region that is located between the collector region 33 and the drift region 31. When the semiconductor device 100 is in the off-state, the buffer region 35 has the function of suppressing the extension of the depletion layer that extends into the drift region 31 from the base region 32. Also, the buffer region 35 may not be included in a configuration according to the embodiment.

The contact region 36 is a $p^+$-type semiconductor region that is located between the base region 32 and the emitter electrode 12. As described below, the contact region 36 contacts the second gate insulating film 52 and is separated from the first gate insulating film 51. The contact region 36 contacts the emitter electrode 12 and is electrically connected with the emitter electrode 12.

A first gate trench 41 extends through the base region 32 and reaches the drift region 31. The first gate insulating film 51 is located at the bottom portion and side portion of the first gate trench 41. The first gate insulating film 51 contacts the drift region 31, the base region 32, and the emitter region 34. The first gate insulating film 51 is, for example, silicon oxide.

The first gate electrode 13 is located in the first gate insulating film 51 and faces at least the base region 32 via the first gate insulating film 51. The first gate electrode 13 is electrically connected to the first gate electrode pad 21 that is described below. The first gate electrode 13 is, for example, polysilicon that includes an impurity. As shown in FIGS. 1A and 1C, multiple stripe-shaped first gate electrodes 13 extend in the Y-direction and are arranged in the X-direction.

A second gate trench 42 extends through the base region 32 and reaches the drift region 31. The second gate trench 42 is located between the first gate trenches 41 that are next to each other in the X-direction. The second gate insulating film 52 is located at the bottom portion and side portion of the second gate trench 42. The second gate insulating film 52 contacts the drift region 31, the base region 32, and the contact region 36. The second gate insulating film 52 is, for example, silicon oxide.

The second gate electrode 14 is located in the second gate insulating film 52. The second gate electrode 14 is not next to the emitter region 34 in the X-direction. The second gate electrode 14 is electrically connected to the second gate electrode pad 22. Similarly to the first gate insulating film 51 as shown in FIGS. 1A and 1C, multiple stripe-shaped second gate electrodes 14 extend in the Y-direction and are arranged in the X-direction. The second gate electrode 14 is, for example, polysilicon that includes an impurity.

The inter-layer insulating film 53 is located between the base region 32 and the emitter electrode 12, between the first gate electrode 13 and the emitter electrode 12, and between the second gate electrode 14 and the emitter electrode 12.

Figure 10:
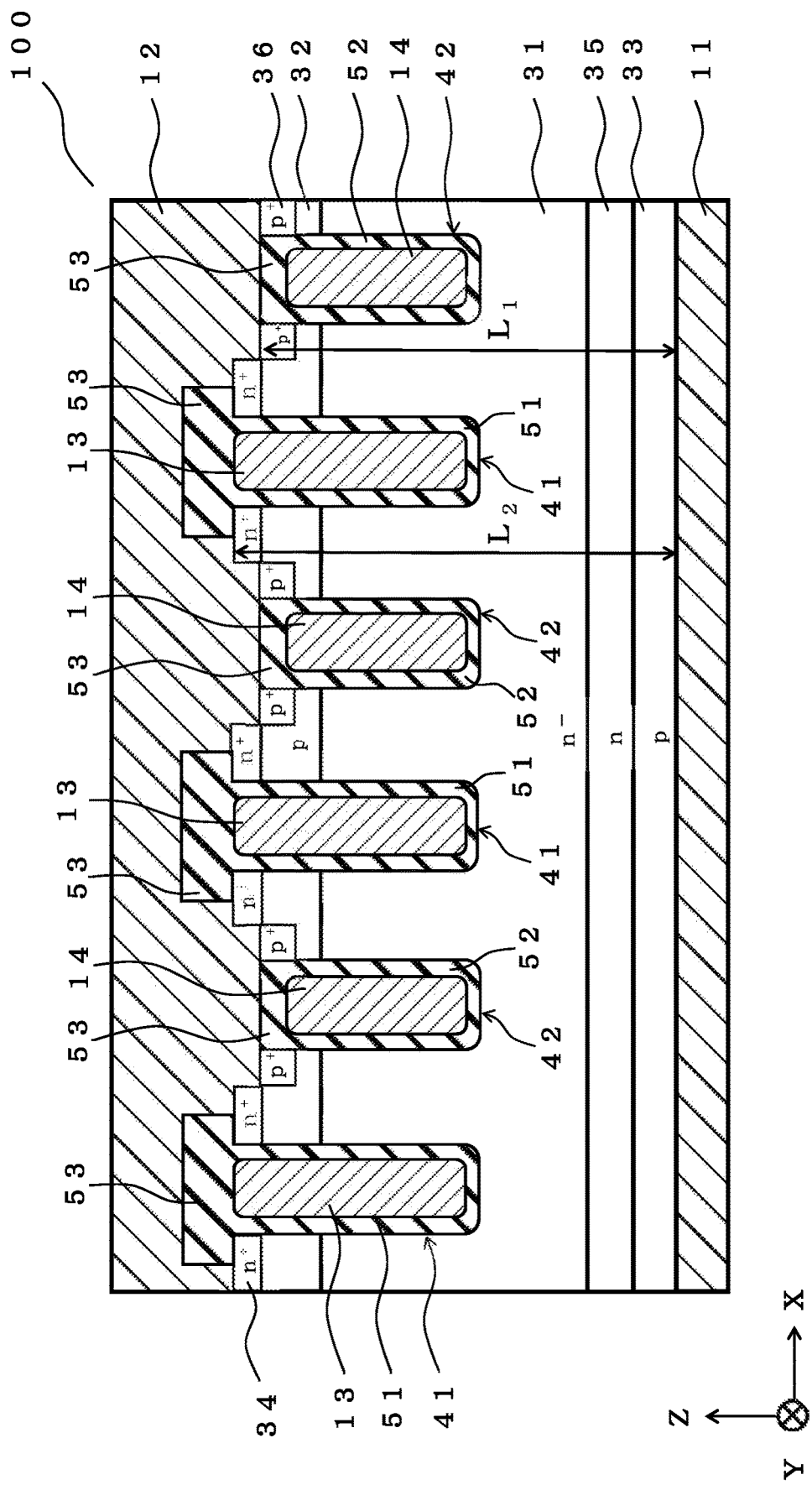
FIG. 10 is a cross-sectional view of the semiconductor device 100 according to the first embodiment.
Figure 11:
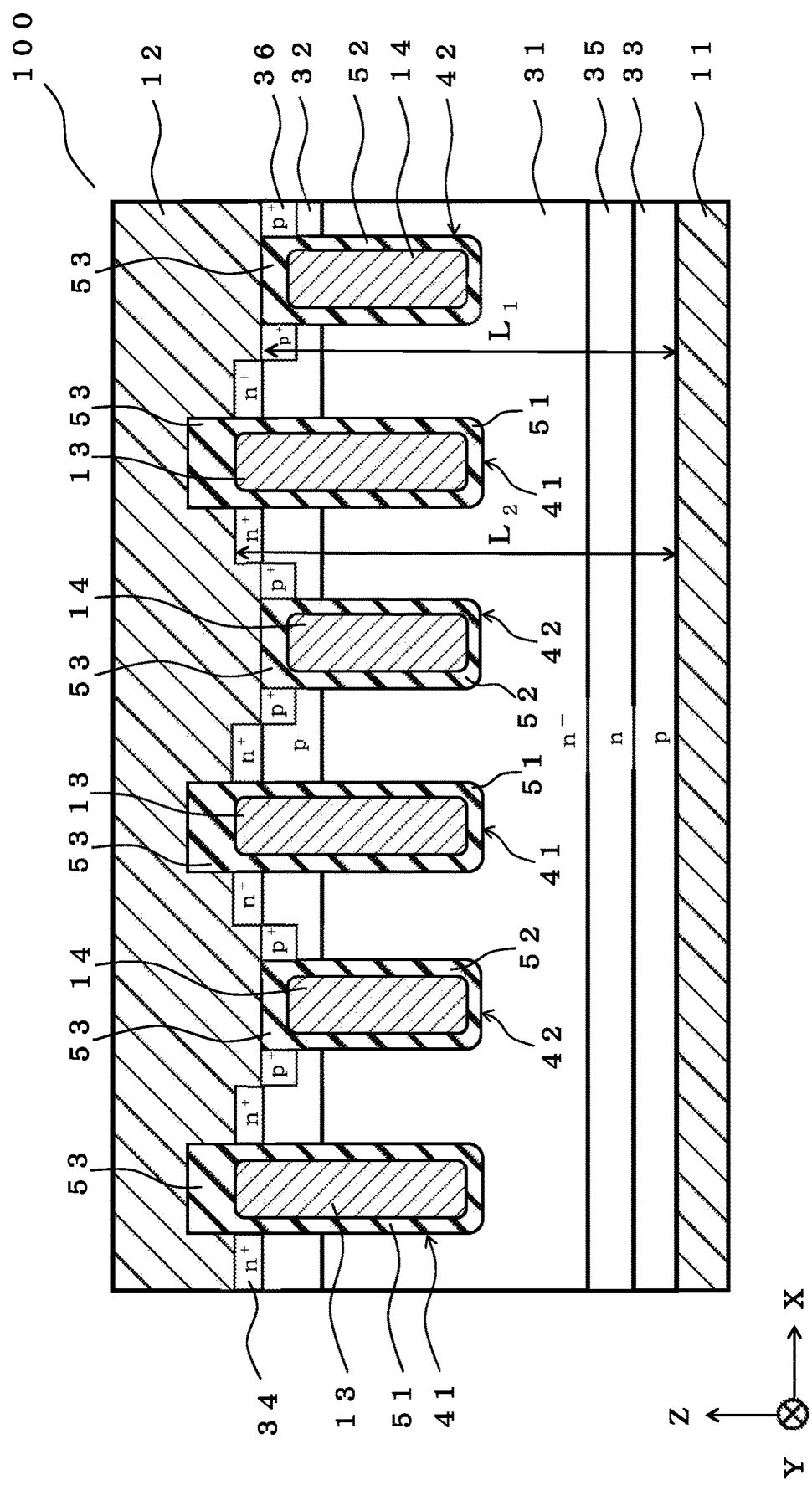
FIG. 11 is a cross-sectional view of the semiconductor device 100 according to the first embodiment.

The emitter region 34 is an $n^+$-type semiconductor region that is located between the base region 32 and the inter-layer insulating film 53. In FIG. 1B, it is shown that the inter-layer insulating film 53 is provided between the entire upper surface of the emitter region 34 and the emitter electrode 12. However, as shown in FIGS. 10 and 11, the entire upper surface or a part of the upper surface of the emitter region 34 may be in direct contact with the emitter electrode 12. A portion of the emitter region 34 is in contact with and electrically connected to the emitter electrode 12. The emitter region 34 contacts the first gate insulating film 51 and is separated from the second gate insulating film 52. The emitter region 34 is a supply source of electrons when the transistor that includes the first gate electrode 13 is in the on-state.

The distance in the Z-direction from the collector electrode 11 to the boundary portion where the contact region 36 and the emitter electrode 12 contact is taken as a distance 1 ($L_1$). The distance in the Z-direction from the collector electrode 11 to the upper surface of the emitter region 34 is taken as a distance 2 ($L_2$). In the semiconductor device 100 of the embodiment, the distance 1 is less than the distance 2. In other words, the inter-layer insulating film 53 that is located in the first gate trench 41 is positioned further toward the emitter electrode 12 side than the inter-layer insulating film 53 that is located in the second gate trench 42.

Also, the interface between the emitter electrode 12 and the contact region 36 is positioned further toward the collector electrode 11 side than the interface between the emitter region 34 and the inter-layer insulating film 53. Accordingly, the side portion of the emitter region 34 contacts the emitter electrode 12.

The drift region 31, the base region 32, the collector region 33, the emitter region 34, the buffer region 35, and the contact region 36 include, for example, silicon (Si), silicon carbide (SiC), gallium nitride (GaN), etc.

The first gate electrode 13 and the second gate electrode 14 may be alternately arranged several at a time in the X-direction instead of being alternately arranged one at a time in the X-direction as in FIG. 1A.

Herein, as shown in FIG. 1A, the region in which the channels of the IGBT are formed, that is, the region in which the current flows, is defined as a cell region 60. In FIG. 1A, the cell region 60 is surrounded with a single dot-dash line. The region that surrounds the cell region 60 and in which a channel is not formed is defined as a termination region 61. The portion of the cell region 60 that is proximate to the termination region 61 in the X-direction is defined as the cell end portion of the cell region 60; and the portion of the cell region 60 that is distant to the termination region 61 in the X-direction is defined as the cell central portion.

The first gate electrode pad 21 is located in the termination region of the semiconductor device 100 and is located at the emitter electrode 12 side in the Z-direction. A first gate voltage (Vg1) is applied to the first gate electrode pad 21 and the first gate electrode 13.

The second gate electrode pad 22 is located in the termination region of the semiconductor device 100 and is located at the emitter electrode 12 side in the Z-direction. The second gate electrode pad 22 is separated from the first gate electrode pad 21. A second gate voltage (Vg2) is applied to the second gate electrode pad 22 and the second gate electrode 14.

As shown in FIG. 1D, the first gate electrode pad 21 and the second gate electrode pad 22 are electrically connected with a gate driver 70. The gate driver 70 controls the voltages that are applied to the first gate electrode pad 21 and the second gate electrode pad 22. The gate driver 70 applies the first gate voltage (Vg1) to the first gate electrode pad 21, and applies the second gate voltage (Vg2) to the second gate electrode pad 22.

Operations of Semiconductor Device 100

Operations of the semiconductor device 100 will now be described.

Figure 2:
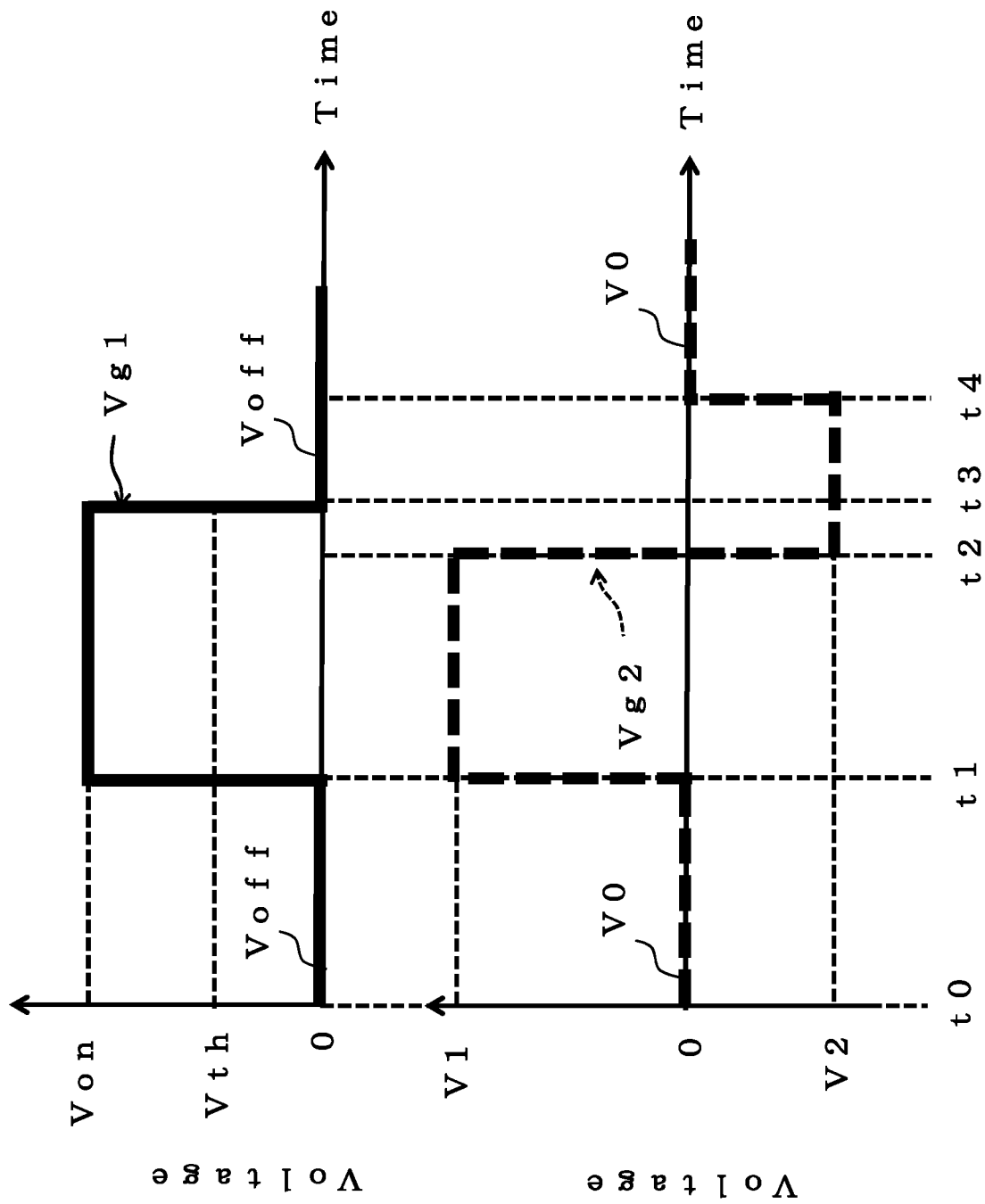
FIG. 2 is an explanatory drawing of a method for driving the semiconductor device 100 according to the first embodiment.

FIG. 2 is a timing chart of the first gate voltage (Vg1) that is applied to the first gate electrode pad 21, and the second gate voltage (Vg2) that is applied to the second gate electrode pad 22. The vertical axis of FIG. 2 is the voltages that are applied to the first gate voltage (Vg1) and the second gate voltage (Vg2). The horizontal axis of FIG. 2 is time, which elapses in the order of a time t0, a time t1 (a first timing), a time t2 (a second timing), a time t3 (a third timing), and a time t4.

In the off-state of the semiconductor device 100, the emitter voltage is applied to the emitter electrode 12. The emitter voltage is, for example, 0 V. The collector voltage is applied to the collector electrode 11. The collector voltage is, for example, not less than 200 V and not more than 6500 V.

The semiconductor device 100 is in the off-state from the time t0 to the time t1. In the off-state of the semiconductor device 100, a turn-off voltage (Voff) is applied to the first gate electrode pad 21. In other words, the first gate voltage (Vg1) is the off-voltage (Voff) from the time t0 to the time t1. The off-voltage (Voff) is less than a threshold voltage (Vth) that forms an n-type inversion layer in the base region 32 that contacts the first gate insulating film 51 and is, for example, 0 V or a negative voltage.

An initial voltage (V0) is applied to the second gate electrode pad 22. Namely, the second gate voltage (Vg2) is the initial voltage (V0) from the time t0 to the time t1. The initial voltage (V0) is a voltage that does not form a p-type inversion layer in the drift region 31 that contacts the second gate insulating film 52 and is, for example, 0 V or a positive voltage.

The semiconductor device 100 is turned on at the time t1. At the time t1, an on-voltage (Von) is applied to the first gate electrode pad 21, and the semiconductor device 100 is set to the on-state. The on-voltage (Von) is a positive voltage that is greater than the threshold voltage (Vth) and is, for example, 15 V. In other words, the first gate voltage (Vg1) becomes the on-voltage (Von) at the time t1. At this time, an n-type inversion layer is formed in the base region 32 that contacts the first gate insulating film 51; and the semiconductor device 100 is set to the on-state.

The semiconductor device 100 is in the on-state from the time t1 to the time t3. In other words, the first gate voltage (Vg1) is the on-voltage (Von) from the time t1 to the time t3. In the on-state, electrons are injected from the emitter region 34 into the base region 32 (the n-type inversion layer); subsequently, the electrons flow in the order of the drift region 31, the buffer region 35, the collector region 33, and the collector electrode 11. On the other hand, holes are injected from the collector region 33 into the buffer region 35; and the holes flow in the order of the drift region 31, the base region 32, the emitter region 34 or the contact region 36, and the emitter electrode 12.

A first voltage (V1) is applied to the second gate electrode pad 22 at the time t1. The first voltage (V1) is, for example, 0 V or a positive voltage. In other words, the second gate voltage (Vg2) becomes the first voltage (V1) at the time t1. The first voltage (V1) may be equal to the initial voltage (V0).

The semiconductor device 100 is turned off at the time t3. At the time t3, the off-voltage (Voff) is applied to the first gate electrode pad 21; and the semiconductor device 100 is set to the off-state. In other words, the first gate voltage (Vg1) becomes the off-voltage (Voff) at and after the time t3.

The time t2 is before the voltage of the first gate electrode pad 21 is changed from the on-voltage (Von) to the off-voltage (Voff), that is, a timing that is before the time t3. The second gate voltage (Vg2) is switched from the first voltage (V1) to a second voltage (V2) at the time t2. The second voltage (V2) is a negative voltage and is, for example, not less than −15 V but less than 0 V. Thereby, a p-type inversion layer is formed in the drift region 31 that contacts the second gate insulating film 52; and the holes that are in the drift region 31 pass through the p-type inversion layer and are ejected into the emitter electrode 12.

The time t2 and the time t3 are, for example, not less than 0.1 microseconds and not more than 10 microseconds.

Finally, the second gate voltage (Vg2) is set to the initial voltage (V0) at the time t4.

Effects of First Embodiment

Effects of the semiconductor device 100 according to the first embodiment will now be described using a semiconductor device 500 according to a comparative example shown in FIG. 3.

Figure 3:
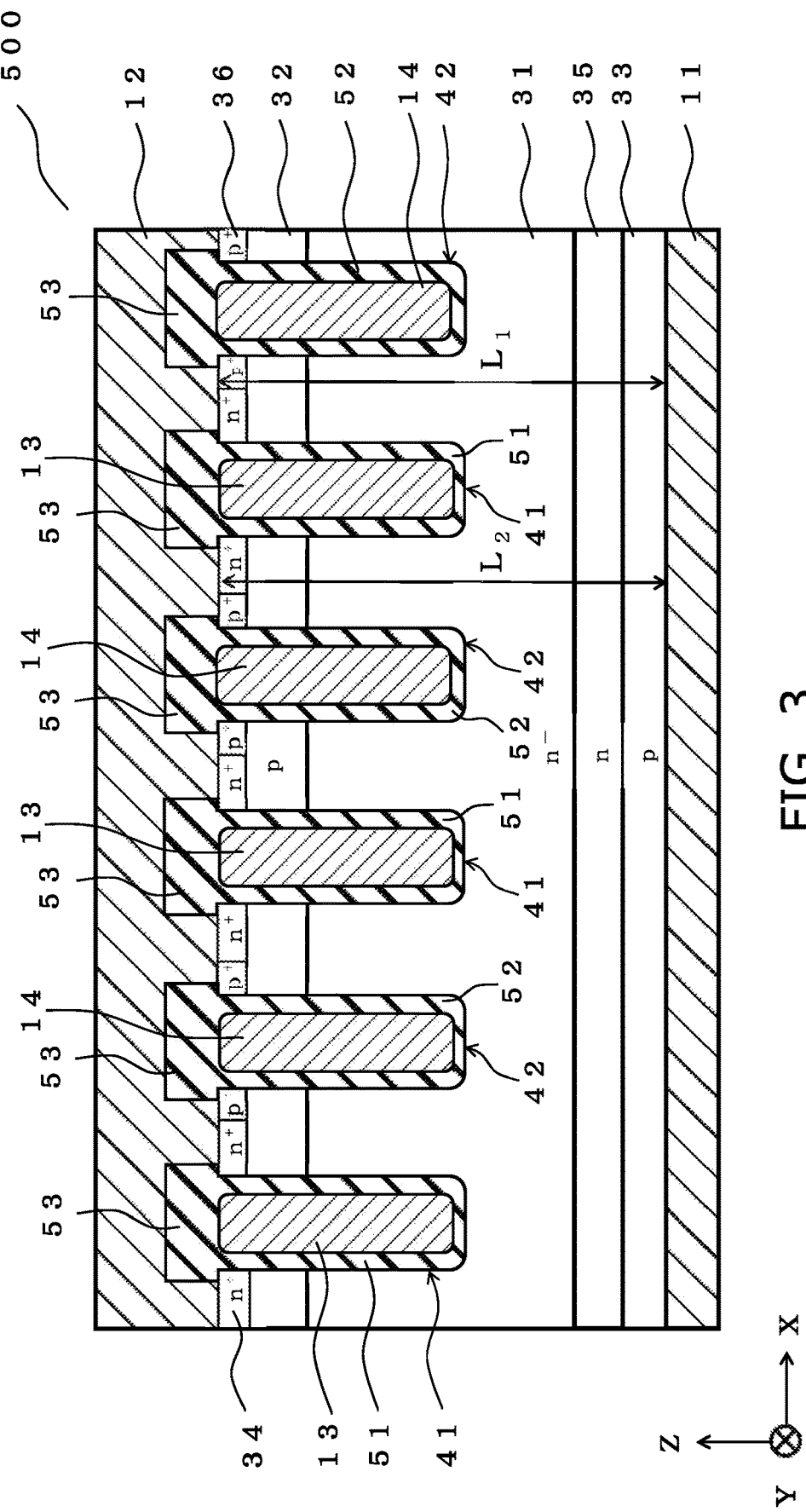
FIG. 3 is a cross-sectional view of a semiconductor device 500 according to a comparative example.

FIG. 3 is a cross-sectional view of the semiconductor device 500 according to the comparative example. The same portions as those of the semiconductor device 100 according to the first embodiment are marked with the same reference numerals.

The semiconductor device 500 according to the comparative example differs from the semiconductor device 100 according to the first embodiment in that the distance 1 ($L_1$) and the distance 2 ($L_2$) are equal.

In the semiconductor device 100 according to the first embodiment and the semiconductor device 500 according to the comparative example, the second gate voltage (Vg2) is changed from the first voltage (V1) to the second voltage (V2) at the time t2. At this time, a p-type inversion layer is formed in the drift region 31 that contacts the second gate insulating film 52. From the time t2 to the time t3, holes pass through the drift region 31 and the p-type inversion layer and are ejected into the emitter electrode 12.

Here, in the semiconductor device 100 according to the first embodiment, the distance 1 is less than the distance 2; and the distance that the holes travel through the drift region 31 and the p-type inversion layer from the time t2 to the time t3 is less than in the semiconductor device 500 according to the comparative example. In other words, in the semiconductor device 100 of the first embodiment, the electrical resistance is small in the path of the holes passing through the drift region 31 and the p-type inversion layer. Therefore, in the semiconductor device 100 of the first embodiment, the holes can be efficiently ejected into the emitter electrode 12; therefore, the turn-off switching loss can be reduced.

Also, in the semiconductor device 100 according to the first embodiment and the semiconductor device 500 according to the comparative example, holes easily concentrate at the drift region 31 that contacts the bottom portion of the second gate trench 42. There is a possibility that a phenomenon called dynamic avalanche may occur in which the breakdown voltage is reduced by the concentrated holes; and breakdown of the semiconductor element may occur. In the semiconductor device 100 according to the first embodiment, compared to the semiconductor device 500, the concentrated holes are more efficiently ejected via the contact region. Therefore, the breakdown immunity of the semiconductor element is improved.

Thus, according to the semiconductor device 100 according to the first embodiment, reduction of the switching loss and improvement of the breakdown immunity are possible.

Modification of First Embodiment

Figure 4:
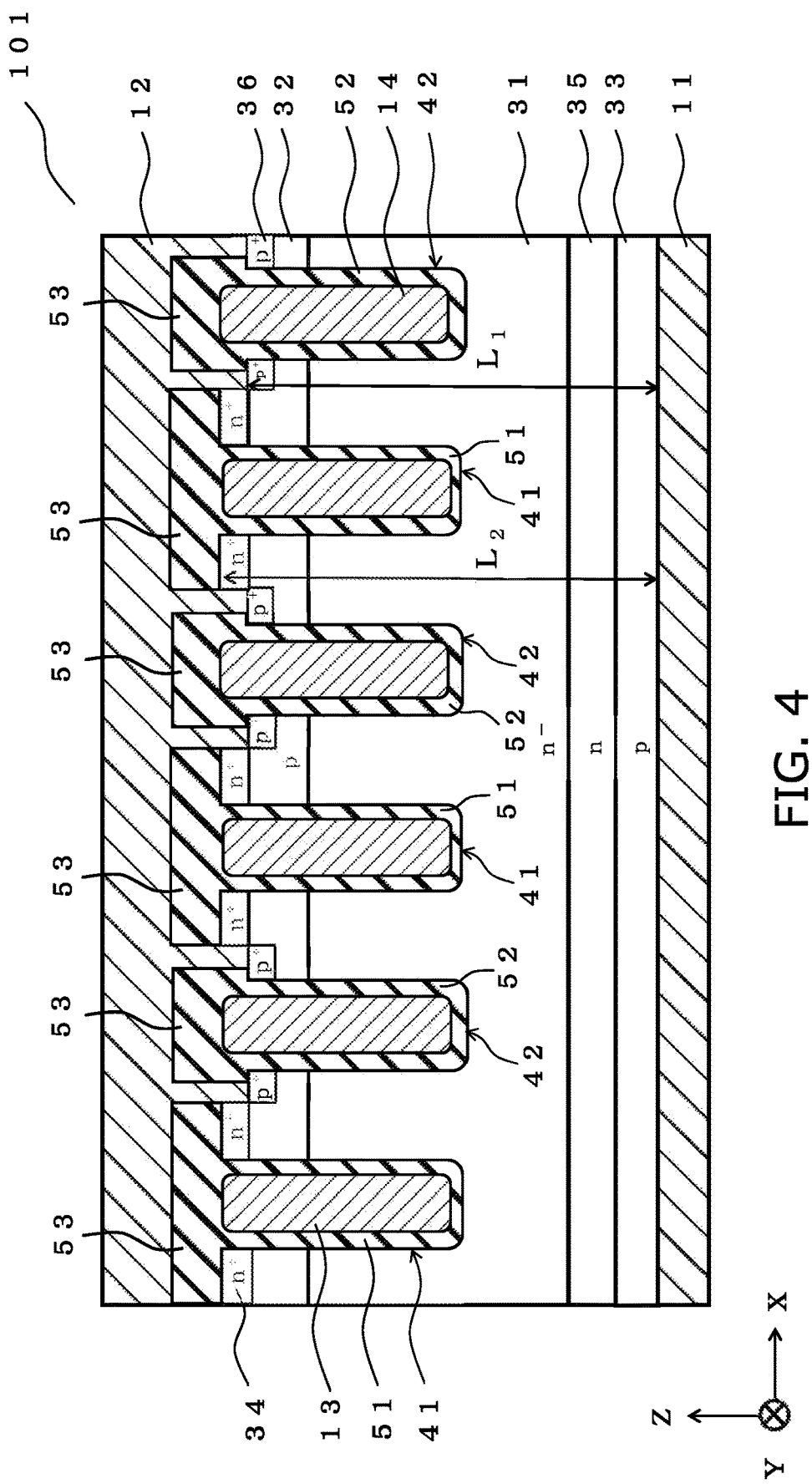
FIG. 4 is a cross-sectional view of a semiconductor device 101 according to a modification of the first embodiment.

A semiconductor device 101 according to a modification of the first embodiment will now be described with reference to FIG. 4. FIG. 4 is a cross-sectional view of the semiconductor device 101 according to the modification of the first embodiment. A duplicate description of the first embodiment is omitted.

The semiconductor device 101 differs from the semiconductor device 100 in that the length of the second gate electrode 14 is equal to the length of the first gate electrode 13 in the Z-direction. However, in the semiconductor device 101, similarly to the semiconductor device 100, the distance 1 is less than the distance 2; and the distance that the holes travel through the drift region 31 and the p-type inversion layer from the time t2 to the time t3 is short compared to that of the semiconductor device 500. Therefore, the semiconductor device 101 can obtain effects similar to those of the semiconductor device 100.

Second Embodiment

Figure 5:
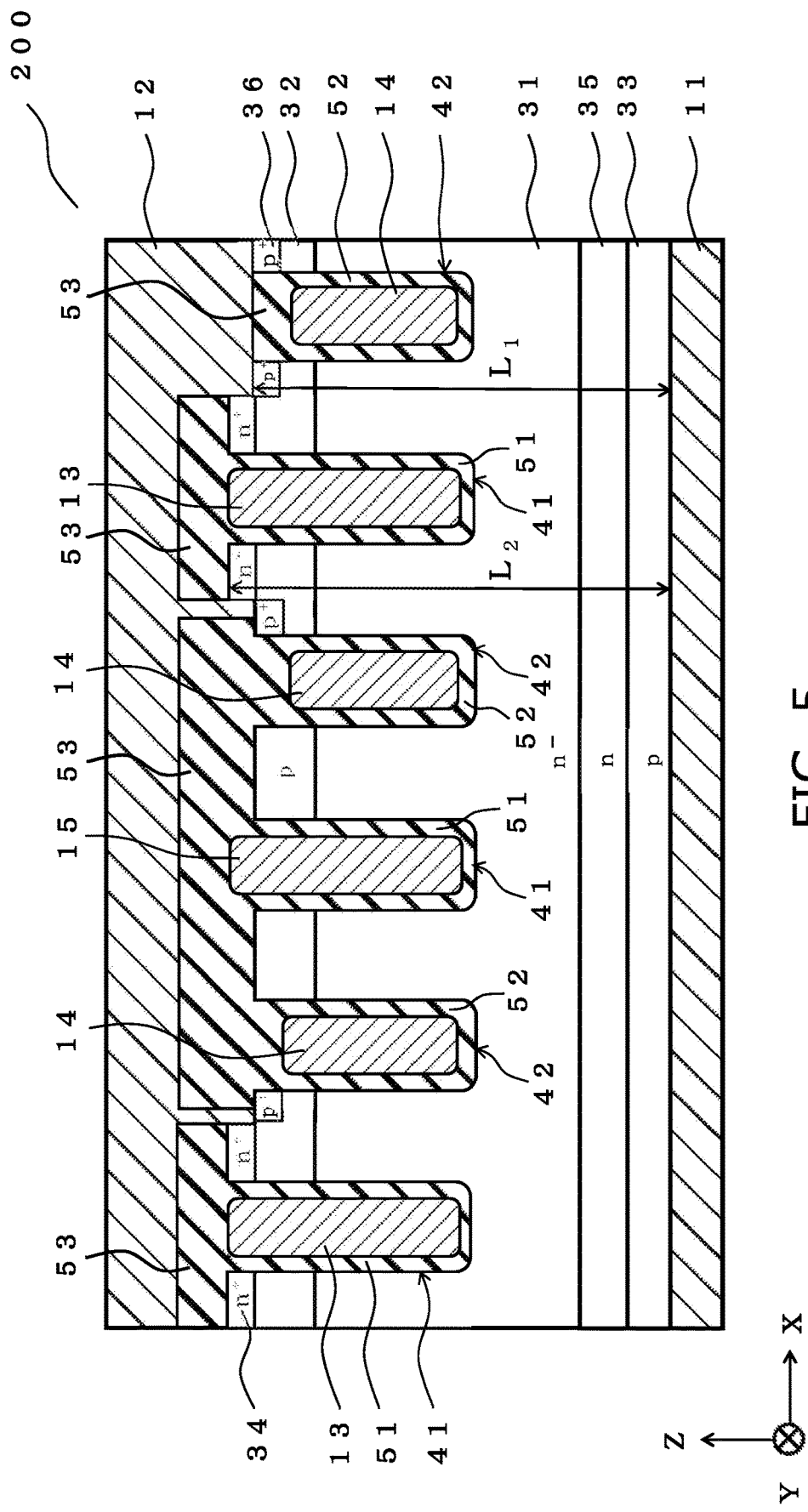
FIG. 5 is a cross-sectional view of a semiconductor device 200 according to a second embodiment.

A semiconductor device 200 of a second embodiment will now be described with reference to FIG. 5. FIG. 5 is a cross-sectional view according to the semiconductor device 200 of the second embodiment.

The semiconductor device 200 according to the second embodiment differs from the semiconductor device 100 in that at least one first gate electrode 13 of the multiple first gate electrodes 13 included in the semiconductor device 100 is modified to be a dummy electrode 15. In the semiconductor device 200, the base region 32 that is located between the second gate electrode 14 and the dummy electrode 15 is insulated from the emitter electrode 12 by the inter-layer insulating film 53 that is located on the base region 32. In other words, in the semiconductor device 200, only the second gate insulating film 52, the drift region 31, and the base region 32 are formed between the second gate electrode 14 and the dummy electrode 15. Here, a duplicate description of the first embodiment is omitted.

For example, the dummy electrode 15 is electrically connected with the emitter electrode 12. In other words, the dummy electrode 15 has the same potential as the emitter electrode 12.

The dummy electrode 15 does not function as a gate electrode. Accordingly, in the semiconductor device 200, the channel density can be adjusted by modifying the number of the dummy electrodes 15. A modification of the channel density is linked to an adjustment of the on-voltage and the turn-off loss. Thereby, in the semiconductor device 200, the on-voltage and the turn-off loss can be appropriately adjusted by adjusting the number of the dummy electrodes 15.

The dummy electrode 15 of the semiconductor device 200 is connected to the emitter electrode 12. The adjustment of the channel density is possible even when the dummy electrode 15 is floating. However, when the dummy electrode 15 is floating, misoperation of the semiconductor device 200, heat generation, or the like may occur due to instability of the potential of the dummy electrode 15. On the other hand, when the dummy electrode 15 has the emitter potential, misoperation of the semiconductor device 200 and heat generation can be suppressed. Accordingly, in the semiconductor device 200, breakdown of the element characteristics can be suppressed.

The adjustment of the channel density is possible even when the dummy electrode 15 has the gate potential. When the dummy electrode 15 has the gate potential, a reduction of the switching speed due to the gate capacitance increase may occur; however, the voltage change and/or current change between the collector electrode 11 and the emitter electrode 12 can be suppressed. As a result, the surge voltage and/or surge current can be suppressed in the semiconductor device 200 in which the dummy electrode 15 has the gate potential.

In the semiconductor device 200, the drift region 31 and the base region 32 that are positioned between the second gate electrode 14 and the dummy electrode 15 are insulated from the emitter electrode 12 by the inter-layer insulating film 53. Accordingly, holes accumulate in the drift region 31 and the base region 32 that are positioned between the second gate electrode 14 and the dummy electrode 15 without being ejected. As a result, the on-voltage of the semiconductor device 200 can be reduced.

Otherwise, the semiconductor device 200 according to the second embodiment is similar to the semiconductor device 100 according to the first embodiment; and the distance 1 is less than the distance 2. Therefore, the holes are efficiently ejected into the emitter electrode 12; and the turn-off switching loss is reduced. Similarly to the semiconductor device 100 according to the first embodiment, the breakdown of the semiconductor element due to the holes generated by dynamic avalanche can be suppressed.

Although one dummy electrode 15 is interposed between the second gate electrodes 14 in FIG. 5, multiple dummy electrodes 15 may be located.

In FIG. 5, the base region 32 is provided at two locations between the second gate electrode 14 and the dummy electrode 15 and is insulated from the emitter electrode 12 by the inter-layer insulating film 53 that is located on the base region 32. However, one of the multiple base regions 32 located between the second gate electrode 14 and the dummy electrode 15 may be connected with the emitter electrode 12 that extends through the inter-layer insulating film 53. In such a case, the effects described above can be adjusted by changing the contact area with the emitter electrode 12.

Modification of Second Embodiment

Figure 6:
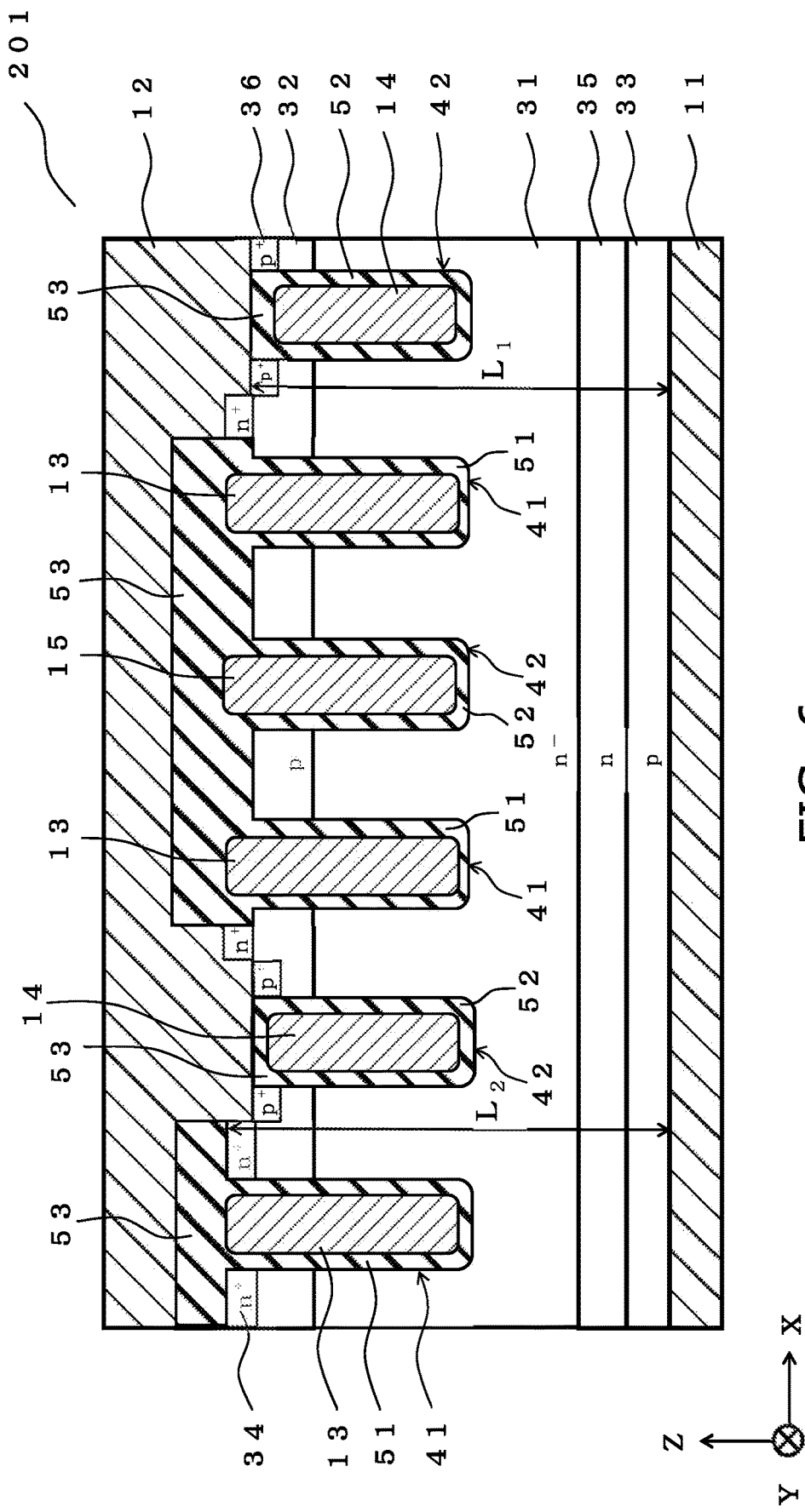
FIG. 6 is a cross-sectional view of a semiconductor device 201 according to a modification of the second embodiment.

A semiconductor device 201 according to a modification of the second embodiment will now be described with reference to FIG. 6. FIG. 6 is a cross-sectional view of the semiconductor device 201 according to the modification of the second embodiment. A duplicate description of the second embodiment is omitted.

In the semiconductor device 201 according to the modification of the second embodiment, at least one second gate electrode 14 of the multiple second gate electrodes 14 according to the first embodiment is replaced with the dummy electrode 15. In the semiconductor device 201, the base region 32 that is located between the first gate electrode 13 and the dummy electrode 15 is insulated from the emitter electrode 12 by the inter-layer insulating film 53 that is located on the base region 32. In other words, in the semiconductor device 201, only the first gate insulating film 51, the drift region 31, and the base region 32 are formed between the first gate electrode 13 and the dummy electrode 15. Here, a duplicate description of the first embodiment is omitted.

In the semiconductor device 201, similarly to the semiconductor device 200 of the second embodiment, the dummy electrode 15 does not function as a gate electrode. Therefore, in the semiconductor device 200, the on-voltage and the turn-off loss can be appropriately adjusted by adjusting the number of the dummy electrodes 15. Also, in the semiconductor device 200, the breakdown of the element characteristics can be suppressed. The on-voltage of the semiconductor device 200 can be reduced.

Similarly to the semiconductor device 100 according to the first embodiment, the distance 1 is less than the distance 2. Therefore, in the semiconductor device 200, the holes are efficiently ejected into the emitter electrode 12; and the turn-off switching loss is reduced. In the semiconductor device 200, the breakdown immunity of the semiconductor element to dynamic avalanche is improved.

Third Embodiment

Figure 7:
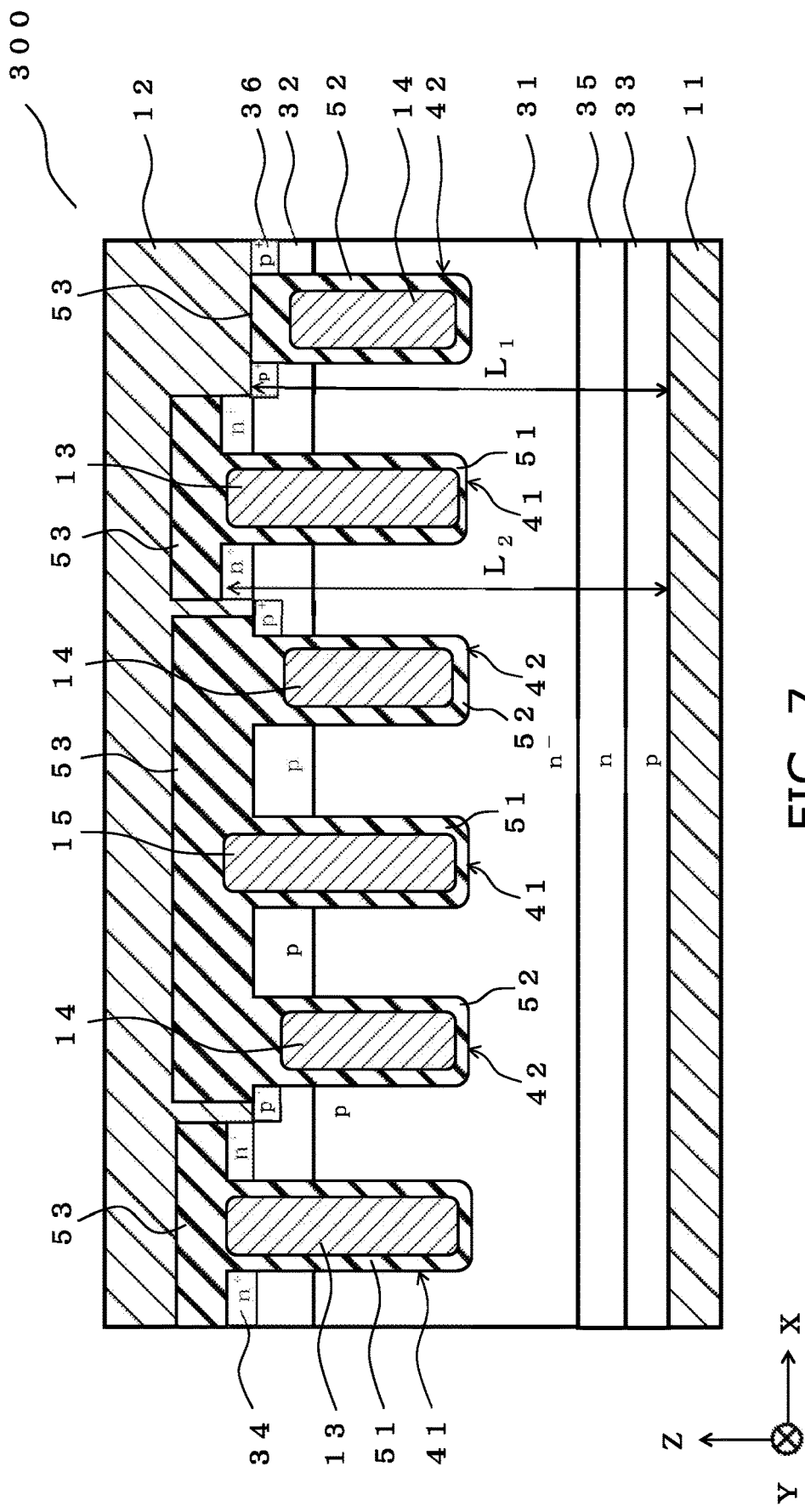
FIG. 7 is a cross-sectional view of a semiconductor device 300 according to a third embodiment.

A semiconductor device 300 according to a third embodiment will now be described with reference to FIG. 7. FIG. 7 is a cross-sectional view of the cell region 60 proximate to the termination region 61 in the semiconductor device 300 according to the third embodiment. FIG. 7 shows the structure of the element region; and the left side of the page is the termination region 61 side. A duplicate description of the second embodiment is omitted.

In the semiconductor device 300 according to the third embodiment, the dummy electrode 15 is located in the cell region 60 according to the second embodiment for the cell region 60 that is proximate to the termination region 61. In the semiconductor device 300, the base region 32 that is located between the second gate electrode 14 and the dummy electrode 15 is insulated from the emitter electrode 12 by the inter-layer insulating film 53 that is located on the base region 32. In other words, in the semiconductor device 300, only the second gate insulating film 52, the drift region 31, and the base region 32 are formed between the second gate electrode 14 and the dummy electrode 15. Here, a duplicate description of the first embodiment is omitted. The second gate electrode 14 that is next to the dummy electrode 15 is next to the contact region 36 in the X-direction with the second gate insulating film 52 interposed, and is electrically connected with the emitter electrode 12 that extends through the inter-layer insulating film 53.

Holes spread in the termination region 61 in the on-state. At turn-off, holes concentrate in the second gate electrode 14 that is proximate to the termination region 61 and are ejected; therefore, the current density increases locally. Therefore, there is a risk that breakdown of the semiconductor device may occur.

On the other hand, in the semiconductor device 300 of the third embodiment, the dummy electrode 15 is included in the cell region 60 that is proximate to the termination region 61. Also, the second gate electrode 14 that is next to the dummy electrode 15 is next to the contact region 36 in the X-direction with the second gate insulating film 52 interposed, and is electrically connected with the emitter electrode 12 that extends through the inter-layer insulating film 53. Therefore, the holes that are in the termination region 61 at turn-off are more easily ejected.

The drift region 31 and the base region 32 that are positioned between the second gate electrode 14 and the dummy electrode 15 are insulated from the emitter electrode 12 by the inter-layer insulating film 53. Accordingly, the holes accumulate in the drift region 31 and the base region 32 positioned between the second gate electrode 14 and the dummy electrode 15 without being ejected. As a result, in the semiconductor device 300, the on-voltage can be reduced, and the hole concentration at turn-off in the second gate electrode 14 that is proximate to the termination region 61 can be suppressed.

In the semiconductor device 300, similarly to the semiconductor device 200 according to the second embodiment, the dummy electrode 15 does not function as a gate electrode. Therefore, in the semiconductor device 300, the on-voltage and the turn-off loss can be appropriately adjusted by adjusting the number of the dummy electrodes 15. Also, in the semiconductor device 300, the breakdown of the element characteristics can be suppressed. The on-voltage of the semiconductor device 300 can be reduced.

Similarly to the semiconductor device 100 according to the first embodiment, the distance 1 is less than the distance 2. Therefore, in the semiconductor device 300, the holes are efficiently ejected into the emitter electrode 12, and the turn-off switching loss is reduced. In the semiconductor device 300, the breakdown immunity of the semiconductor element to dynamic avalanche is improved.

Fourth Embodiment

Figure 8:
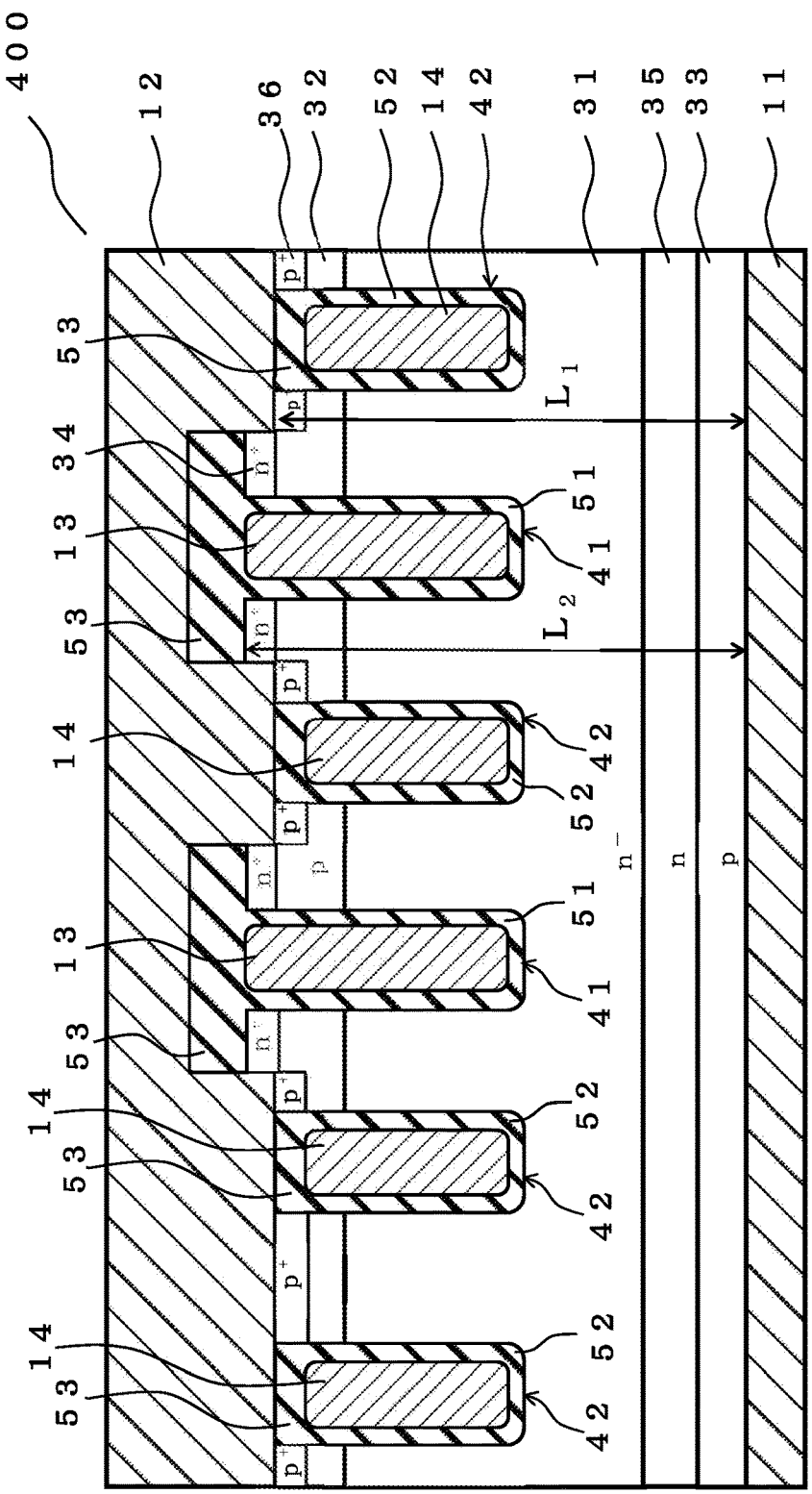
FIG. 8 is a cross-sectional view of a semiconductor device 400 according to a fourth embodiment.
Figure 9:
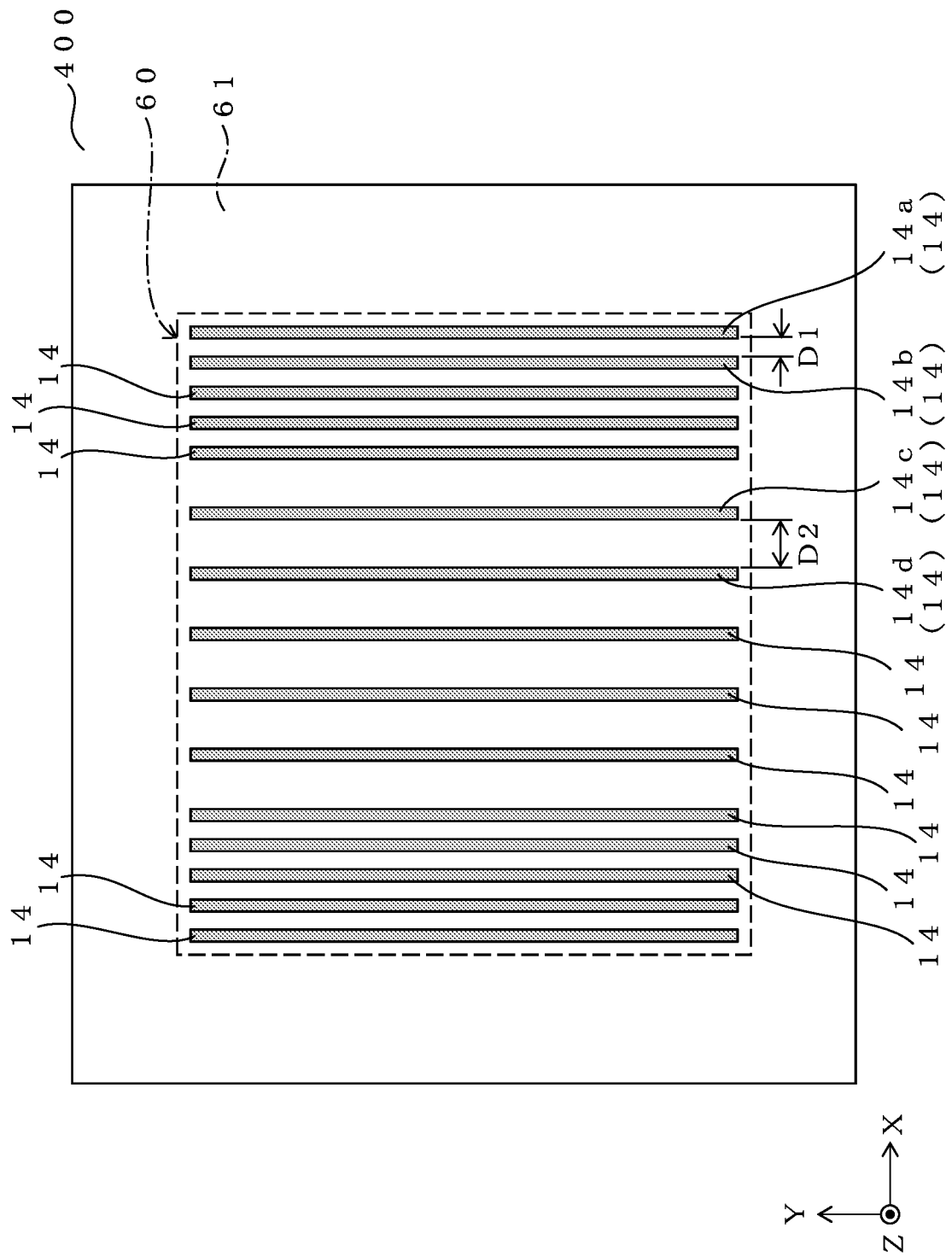
FIG. 9 is a plan view of the semiconductor device 400 according to the fourth embodiment.

A semiconductor device 400 according to a fourth embodiment will now be described with reference to FIG. 8. FIG. 8 is a cross-sectional view of the cell region 60 that is proximate to the termination region 61 in the semiconductor device 400 according to the fourth embodiment. FIG. 8 shows the structure of the element region; and the left side of the page is the termination region 61 side. FIG. 9 is a plan view of the semiconductor device 400 according to the fourth embodiment. FIG. 9 schematically shows only the second gate electrodes 14 and the outer edge of the semiconductor device 400; the other components are not illustrated. The second gate electrodes 14 are shown in gray for easier viewing of the drawing. Here, a duplicate description of the first embodiment is omitted.

The semiconductor device 400 according to the fourth embodiment differs from the semiconductor device 100 according to the first embodiment in that multiple second gate electrodes 14 are formed in the cell region 60 that is proximate to the termination region 61. Specifically, in the semiconductor device 400, the proportion of the second gate electrodes 14 that are formed is higher in the cell region 60 that is proximate to the termination region 61 than in the central region of the cell region 60.

In the semiconductor device 400 as described above, the cell region 60 and the termination region 61 are set. The termination region 61 surrounds the cell region 60. The first gate electrode 13 and the second gate electrode 14 are located in the cell region 60. In the cell region 60, the arrangement density of the second gate electrodes 14 is high in the region positioned at the two X-direction (second-direction) ends compared to the region positioned at the X-direction center.

Therefore, among the multiple second gate electrodes 14 that are located in the cell region 60, a first distance D1 is less than a second distance D2, wherein the first distance D1 is the distance between a first electrode 14a of the second gate electrodes 14 that is the most proximate to the termination region 61 in the X-direction (the second direction) and a second electrode 14b of the second gate electrodes 14 that is located next to the first electrode 14a of the second gate electrodes 14, and the second distance D2 is the distance between a third electrode 14c of the second gate electrodes 14 that is located between the second electrode 14b of the second gate electrodes 14 and the center of the cell region 60 and a fourth electrode 14d of the second gate electrodes 14 that is located next to the third electrode 14c of the second gate electrodes 14. When the cell region 60 is rectangular when viewed along the Z-direction, the center of the cell region 60 is the intersection of the diagonal lines of the cell region 60 and substantially matches, for example, the intersection of the diagonal lines of the semiconductor device 400.

In the semiconductor device 400 according to the fourth embodiment, multiple second gate electrodes 14 are formed at the cell region 60 side. Therefore, the holes that exist in the termination region 61 at turn-off can be easily ejected, and the increase of the current density can be further prevented. Accordingly, in the semiconductor device 400, the breakdown of the semiconductor element can be suppressed.

Otherwise, the semiconductor device 400 according to the fourth embodiment is similar to the semiconductor device 100 according to the first embodiment; and the distance 1 is less than the distance 2. Therefore, in the semiconductor device 400, the holes are efficiently ejected into the emitter electrode 12; and the turn-off switching loss is reduced. Also, in the semiconductor device 400, the breakdown immunity of the semiconductor element to dynamic avalanche is improved.

According to embodiments, a semiconductor device and a method for controlling a semiconductor device can be provided in which the switching loss can be reduced and the element breakdown can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a second electrode separated from the first electrode in a first direction;
a first semiconductor region located between the first electrode and the second electrode in the first direction, the first semiconductor region being of a first conductivity type;
a second semiconductor region located between the first semiconductor region and the second electrode, the second semiconductor region being of a second conductivity type;
a third semiconductor region located between the first semiconductor region and the first electrode, the third semiconductor region being of the second conductivity type and being electrically connected with the first electrode;
a first gate electrode facing the second semiconductor region via a first insulating film in a second direction, the first gate electrode facing the second electrode via a third insulating film contacting the first insulating film, the second direction crossing the first direction, a plurality of the first gate electrodes being provided;
a second gate electrode facing the second semiconductor region via a second insulating film in the second direction, the second gate electrode facing the second electrode via the third insulating film contacting the second insulating film, a different voltage from the first gate electrode being applied to the second gate electrode, a plurality of the second gate electrodes being provided;

a fourth semiconductor region located between the second semiconductor region and the second electrode, the fourth semiconductor region being of the first conductivity type and being next to the first gate electrode with the first or third insulating film interposed; and a fifth semiconductor region located between the second semiconductor region and the second electrode, the fifth semiconductor region being of the second conductivity type, being next to the second gate electrode with the second or third insulating film interposed, and including a boundary portion that electrically contacts the second electrode, a distance between an upper surface of the fourth semiconductor region and the first electrode being greater than a distance between the boundary portion and the first electrode.

2. The device according to claim 1, wherein
a second-conductivity-type impurity concentration of the fifth semiconductor region is greater than a second-conductivity-type impurity concentration of the second semiconductor region.

3. The device according to claim 1, further comprising:
a first gate electrode pad electrically connected with the first gate electrode; and
a second gate electrode pad electrically connected with the second gate electrode.

4. The device according to claim 1, wherein
the fifth semiconductor region positioned between a first one of the first gate electrodes and the first or second gate electrode next to the first one of the first gate electrodes contacts the second electrode with a contact area different from a contact area of the second electrode in contact with the fifth semiconductor region positioned between a second one of the first gate electrodes and the first or second gate electrode next to the second one of the first gate electrodes.

5. The device according to claim 1, wherein
the second semiconductor region positioned between the first gate electrode and the first or second gate electrode next to the first gate electrode is electrically insulated from the second electrode.

6. The device according to claim 1, wherein
at least one of the first gate electrodes of the plurality of first gate electrodes is electrically connected with the second electrode.

7. The device according to claim 1, comprising:
a cell region including the first and second gate electrodes; and
a termination region surrounding the cell region,
the first gate electrode located at the termination region side in the second direction being connected to the second electrode,
the second gate electrode next to the first gate electrode connected to the second electrode being next to the fifth semiconductor region with the second insulating film interposed.

8. The device according to claim 7, wherein
more of the second gate electrodes are provided in the cell region proximate to the termination region in the second direction than in the cell region distant to the termination region in the second direction.

9. The device according to claim 1, comprising:
a cell region including the first and second gate electrodes; and
a termination region surrounding the cell region,
among a plurality of the second gate electrodes located in the cell region, a first distance between a first one of the second gate electrodes and a second one of the second gate electrodes being less than a second distance between a third one of the second gate electrodes and a fourth one of the second gate electrodes,
the first one of the second gate electrodes being most proximate to the termination region in the second direction,
the second one of the second gate electrodes being located next to the first one of the second gate electrodes,
the third one of the second gate electrodes being located between the second one of the second gate electrodes and a center of the cell region,
the fourth one of the second gate electrodes being located next to the third one of the second gate electrodes.

10. A method for controlling the semiconductor device according to claim 1, the method comprising:
at a first timing, changing a first gate voltage applied to the first gate electrode from a voltage less than a threshold voltage to a voltage not less than the threshold voltage;
at a second timing continuing from the first timing, changing a second gate voltage applied to the second gate electrode from a first voltage to a second voltage; and
at a third timing continuing from the second timing, changing the first gate voltage from the voltage not less than the threshold voltage to a voltage less than the threshold voltage.

11. The method according to claim 10, wherein
the second voltage is a negative voltage when the first conductivity type is an n-type, and
the second voltage is a positive voltage when the first conductivity type is a p-type.

12. The method according to claim 10, wherein
the second voltage applied to the second gate electrode forms an inversion layer in the first semiconductor region contacting the second insulating film.

* * * * *